United States Patent
Kobayakawa et al.

(10) Patent No.: US 7,858,419 B2
(45) Date of Patent: *Dec. 28, 2010

(54) GALLIUM NITRIDE-BASED COMPOUND SEMICONDUCTOR MULTILAYER STRUCTURE AND PRODUCTION METHOD THEREOF

(75) Inventors: Masato Kobayakawa, Ichihara (JP); Hitoshi Takeda, Ichihara (JP); Hisayuki Miki, Ichihara (JP); Tetsuo Sakurai, Ichihara (JP)

(73) Assignee: Showa Denko K.K., Tokyo (JP)

( * ) Notice: Subject to any disclaimer, the term of this patent is extended or adjusted under 35 U.S.C. 154(b) by 41 days.

This patent is subject to a terminal disclaimer.

(21) Appl. No.: 12/338,882

(22) Filed: Dec. 18, 2008

(65) Prior Publication Data

US 2009/0104728 A1 Apr. 23, 2009

Related U.S. Application Data (62) Division of application No. 10/589,610, filed as application No. PCT/JP2005/003428 on Feb. 23, 2005, now Pat. No. 7,482,635.

(60) Provisional application No. 60/549,440, filed on Mar. 3, 2004.

(30) Foreign Application Priority Data

Feb. 24, 2004 (JP) .............................. 2004-048500

(51) Int. Cl.
*H01L 21/00* (2006.01)
(52) U.S. Cl. ................... 438/47; 257/E33.001
(58) Field of Classification Search ............. 438/44–47, 438/69, 956, 918; 257/E33.001
See application file for complete search history.

(56) References Cited

U.S. PATENT DOCUMENTS

| 6,172,382 B1 | 1/2001 | Nagahama et al. |
| 6,608,330 B1* | 8/2003 | Yamada ....................... 257/90 |
| 6,906,352 B2* | 6/2005 | Edmond et al. ............... 257/94 |
| 7,601,979 B2* | 10/2009 | Miki et al. ..................... 257/9 |
| 2003/0151044 A1 | 8/2003 | Yamada |
| 2003/0160246 A1 | 8/2003 | Narayan et al. |
| 2005/0242364 A1 | 11/2005 | Moustakas et al. |
| 2006/0157730 A1 | 7/2006 | Otsuka et al. |
| 2006/0163605 A1 | 7/2006 | Miyahara |

FOREIGN PATENT DOCUMENTS

| CN | 1249853 | 4/2000 |
| EP | 0 772 249 A2 | 5/1997 |

(Continued)

*Primary Examiner*—Quoc D Hoang
(74) *Attorney, Agent, or Firm*—Sughrue Mion, PLLC (57) ABSTRACT

An object of the present invention is to provide a gallium nitride compound semiconductor multilayer structure useful for producing a gallium nitride compound semiconductor light-emitting device which operates at low voltage while maintaining satisfactory light emission output. The inventive gallium nitride compound semiconductor multilayer structure comprises a substrate, and an n-type layer, a light-emitting layer, and a p-type layer formed on the substrate, the light-emitting layer having a multiple quantum well structure in which a well layer and a barrier layer are alternately stacked repeatedly, said light-emitting layer being sandwiched by the n-type layer and the p-type layer, wherein the well layer comprises a thick portion and a thin portion, and the barrier layer contains a dopant.

15 Claims, 6 Drawing Sheets

FOREIGN PATENT DOCUMENTS

| | | |
|---|---|---|
| EP | 1 017 113 A1 | 7/2000 |
| JP | 2003-78169 A | 3/2003 |
| JP | 2003-101160 A | 4/2003 |
| JP | 2003-179260 A | 6/2003 |
| JP | 2003-289156 A | 10/2003 |
| JP | 2004-6991 A | 1/2004 |

* cited by examiner

Fig. 1

Fig. 2

GALLIUM NITRIDE-BASED COMPOUND SEMICONDUCTOR MULTILAYER STRUCTURE AND PRODUCTION METHOD THEREOF

CROSS REFERENCE TO RELATED APPLICATIONS

This application is a Divisional of U.S. patent application Ser. No. 10/589,610, which is a 371 of PCT Application No. PCT/JP2005/003428 filed Feb. 23, 2005, which claims benefit of U.S. Provisional Application No. 60/549,440 filed Mar. 3, 2004. The above-noted applications are incorporated herein by reference in their entirety.

TECHNICAL FIELD

The present invention relates to a gallium nitride compound semiconductor multilayer structure useful for producing a high-power light-emitting device which emits ultraviolet to blue light, or green light, and to a method for producing the semiconductor multilayer structure.

BACKGROUND ART

In recent years, gallium nitride compound semiconductors have become of interest as materials for producing a light-emitting device which emits light of short wavelength. Generally, a gallium nitride compound semiconductor is grown on a substrate made of an oxide crystal such as a sapphire single crystal, a silicon carbide single crystal, or a Group III-V compound single crystal, through a method such as metal-organic chemical vapor deposition (MOCVD), molecular-beam epitaxy (MBE), or hydride vapor phase epitaxy (HVPE).

At present, the crystal growth method that is most widely employed in the industry includes growing a semiconductor crystal on a substrate such as sapphire, SiC, GaN, or AlN, through metal-organic chemical vapor deposition (MOCVD). Specifically, an n-type layer, a light-emitting layer, and a p-type layer are grown on the aforementioned substrate placed in a reactor tube, by use of a Group III organometallic compound and a Group V source gas at about 700° C. to about 1,200° C.

After growth of the above layers, a negative electrode is formed on the substrate or the n-type layer, and a positive electrode is formed on the p-type layer, whereby a light-emitting device is fabricated.

Conventionally, such a light-emitting layer is formed from InGaN whose composition is controlled so as to modulate the light emission wavelength. The active layer is sandwiched by layers having a bandgap higher than that of InGaN, thereby forming a double-hetero structure, or is incorporated into a multiple quantum well structure on the basis of the quantum well effect.

In a gallium nitride compound semiconductor light-emitting device having a light-emitting layer of a multiple quantum well structure, when the thickness of a well layer is adjusted to 2 to 3 nm, satisfactory output is attained, but a problematically high operating voltage is required. In contrast, when the thickness of the well layer is 2 nm or less, the operating voltage is lowered, but the output is poor.

There has been also proposed a quantum dot structure in which a light-emitting layer in the form of a dot pattern is formed as described below.

For example, Japanese Patent Application Laid-Open (kokai) Nos. 10-79501 and 11-354839 disclose light-emitting devices having a light-emitting layer of a quantum dot structure. The quantum dot structure is formed through an anti-surfactant effect. However, the above-proposed quantum dot structure has a problem. That is, as the total area of dots (light-emitting dots) is excessively small with respect to the area where current flows, overall emission output with respect to input current is lowered, even though the emission efficiency of each light-emitting dot is enhanced. These patent documents do not stipulate the area covered with dots. However, the area that is not covered with dots is considerably greater than the area covered with dots, as calculated from the dot size and preferred dot density described in the specifications.

In addition, there has been proposed a quantum box structure including a light-emitting box having an area greater than that of a light-emitting dot.

For example, Japanese Laid-Open Patent Application (kokai) No. 2001-68733 discloses an In-containing quantum box structure which is formed by annealing a formed quantum well structure in hydrogen so as to sublimate the well layer. The dimensions of each light-emitting box are preferably as follows: 0.5 nm≦height≦50 nm and 0.5 nm≦width≦200 nm, and a light-emitting box (height: 6 nm, width: 40 nm) is fabricated in a Working Example. Although the light-emitting box density is not stipulated, the area which is not covered with light-emitting boxes is greater than or equal to the area which is covered with light-emitting boxes, as shown in an attached drawing.

Briefly, each of the structures based on the aforementioned techniques do not include quantum dots or quantum boxes in the area on which quantum dots or boxes are not provided. In addition, the area which is covered with quantum boxes or dots is very small and, in contrast, the area which is not covered with quantum boxes or dots is large.

In such a structure in which the area that is covered with light-emitting boxes or dots is very small and no light-emitting elements are provided in the area that is not covered with quantum boxes or dots, the operating voltage can be lowered, but emission output is problematically reduced. Thus, such a structure cannot be used in practice.

Japanese Laid-Open Patent Application (kokai) No. 2001-68733 also discloses that a quantum box structure is fabricated by forming a conventional quantum well structure and annealing the structure in hydrogen, thereby decomposing an InGaN crystal provided on through-hole dislocations. However, annealing a quantum well structure in hydrogen induces a release of In from a portion to serve as a quantum box structure, thereby blue-shifting the emission wavelength, which is not preferred.

Also, in US Patent Application Publication No. US2003/0160229A1, a multiple quantum well structure, in which a well layer has a thickness which changes periodically, is disclosed. However, in regard to a concrete structure of a light-emitting device, a structure in which a light-emitting layer having an undoped multiple quantum well structure is sandwiched by an Si-doped n-type layer and an Mg-doped p-type layer, is only disclosed.

DISCLOSURE OF INVENTION

An object of the present invention is to provide a gallium nitride compound semiconductor multilayer structure useful for producing a gallium nitride compound semiconductor light-emitting device which operates at low voltage while maintaining satisfactory light emission output.

Another object of the invention is to provide a method for forming a light-emitting layer which prevents blue-shifting of emitted light.

The present invention provides the following.

(1) A gallium nitride compound semiconductor multilayer structure comprising a substrate, and an n-type layer, a light-emitting layer, and a p-type layer formed on the substrate, the light-emitting layer having a multiple quantum well structure in which a well layer and a barrier layer are alternately stacked repeatedly, said light-emitting layer being sandwiched by the n-type layer and the p-type layer, wherein the well layer comprises a thick portion and a thin portion, and the barrier layer contains a dopant.

(2) A gallium nitride compound semiconductor multilayer structure according to (1) above, wherein the well layer contains In.

(3) A gallium nitride compound semiconductor multilayer structure according to (2) above, wherein the upper surface of the well layer is covered with a thin layer not containing In.

(4) A gallium nitride compound semiconductor multilayer structure according to any one of (1) to (3) above, wherein the dopant is at least one member selected from the group consisting of C, Si, Ge, Sn, Pb, O, S, Se, Te, Po, Be, Mg, Ca, Sr, Ba, and Ra.

(5) A gallium nitride compound semiconductor multilayer structure according to any one of (1) to (4) above, wherein the dopant is contained at a concentration of $1\times10^{17}$ cm$^{-3}$ to $1\times10^{19}$ cm$^{-3}$.

(6) A gallium nitride compound semiconductor multilayer structure according to any one of (1) to (5) above, wherein the thick portion has a thickness of 1.5 nm to 5 nm.

(7) A gallium nitride compound semiconductor multilayer structure according to any one of (1) to (6) above, wherein the thick portion has an arithmetic mean width, as measured in a cross-section of the multilayer structure, of 10 nm or more.

(8) A gallium nitride compound semiconductor multilayer structure according to any one of (1) to (7) above, wherein the thin portion has a thickness of less than 1.5 nm.

(9) A gallium nitride compound semiconductor multilayer structure according to any one of (1) to (8) above, wherein the thin portion has an arithmetic mean width, as measured in a cross-section of the multilayer structure, of 100 nm or less.

(10) A gallium nitride compound semiconductor multilayer structure according to any one of (1) to (9) above, wherein the difference in thickness between the thick portion and the thin portion falls within a range of 1 nm to 3 nm.

(11) A gallium nitride compound semiconductor multilayer structure according to any one of (1) to (10) above, wherein the thick portion has a total width, as measured in a cross-section of the multilayer structure, accounting for 30% or more the entire width of the well layer.

(12) A gallium nitride compound semiconductor multilayer structure according to any one of (1) to (11) above, wherein the multiple quantum well structure is repeatedly stacked 3 to 10 times.

(13) A gallium nitride compound semiconductor multilayer structure according to any one of (1) to (12) above, wherein the barrier layer is formed of a gallium nitride compound semiconductor selected from among GaN, AlGaN, and InGaN which has an In content lower than that of InGaN forming the well layer.

(14) A gallium nitride compound semiconductor multilayer structure according to (13) above, wherein the barrier layer is formed of GaN.

(15) A gallium nitride compound semiconductor multilayer structure according to any one of (1) to (14) above, wherein the barrier layer has a thickness of 7 nm to 50 nm.

(16) A gallium nitride compound semiconductor multilayer structure according to (15) above, wherein the barrier layer has a thickness of 14 nm or more.

(17) A gallium nitride compound semiconductor light-emitting device, wherein the device has a negative electrode and a positive electrode, the negative electrode and the positive electrode being provided on the n-type layer and the p-type layer of a gallium nitride compound semiconductor multilayer structure according to any one of (1) to (16) above, respectively.

(18) A gallium nitride compound semiconductor light-emitting device according to (17) above, which has a flip-chip-type device structure.

(19) A gallium nitride compound semiconductor light-emitting device according to (18) above, wherein the positive electrode has a reflection-type structure.

(20) A gallium nitride compound semiconductor light-emitting device according to any one of (17) to (19) above, wherein an operating voltage falls within a range of 2.9 V to 3.2 V at a current of 20 mA.

(21) A gallium nitride compound semiconductor light-emitting device according to any one of (17) to (19) above, wherein a take-off voltage falls within a range of 2.5 V to 3.2 V.

(22) A lamp comprising a gallium nitride compound semiconductor light-emitting device according to any one of (17) to (21) above.

(23) A lamp comprising a fluorescent material and a gallium nitride compound semiconductor light-emitting device according to any one of (17) to (21) above.

(24) A method for producing a gallium nitride compound semiconductor multilayer structure comprising a substrate, and an n-type layer, a light-emitting layer, and a p-type layer formed on the substrate, the light-emitting layer having a multiple quantum well structure in which a well layer and a barrier layer are alternately stacked repeatedly, said light-emitting layer being sandwiched by the n-type layer and the p-type layer, wherein the method comprises forming a thick portion and a thin portion in the well layer by doping the barrier layer with a dopant.

(25) A method for producing a gallium nitride compound semiconductor multilayer structure according to (24) above, wherein the dopant is contained at a concentration of $1\times10^{17}$ cm$^{-3}$ to $1\times10^{19}$ cm$^{-3}$.

(26) A method for producing a gallium nitride compound semiconductor multilayer structure according to any one of (1) to (16) above, wherein the method comprises a step of forming the well layer, which step includes a step of growing a gallium nitride compound semiconductor and a step of decomposing or sublimating a portion of the gallium nitride compound semiconductor.

(27) A method for producing a gallium nitride compound semiconductor multilayer structure according to (26) above, wherein the step of growing is performed at a substrate temperature of T1 and the step of decomposing or sublimating is performed at a substrate temperature of T2, wherein T1 and T2 satisfy the relationship: T1≦T2.

(28) A method for producing a gallium nitride compound semiconductor multilayer structure according to (27) above, wherein T1 falls within a range of 650 to 900° C.

(29) A method for producing a gallium nitride compound semiconductor multilayer structure according to (28) above, wherein T2 falls within a range of 700 to 1,000° C.

(30) A method for producing a gallium nitride compound semiconductor multilayer structure according to any one of (27) to (29) above, wherein the step of decomposing or sublimating is performed while the substrate temperature T1 is elevated to T2.

(31) A method for producing a gallium nitride compound semiconductor multilayer structure according to (30) above, wherein the substrate temperature T1 is elevated to T2 at a temperature elevation rate of 1° C./min to 100° C./min.

(32) A method for producing a gallium nitride compound semiconductor multilayer structure according to (31) above, wherein the temperature elevation rate is 5° C./min to 50° C./min.

(33) A method for producing a gallium nitride compound semiconductor multilayer structure according to any one of (30) to (32) above, wherein the substrate temperature T1 is elevated to T2 over 30 seconds to 10 minutes.

(34) A method for producing a gallium nitride compound semiconductor multilayer structure according to (33) above, wherein the substrate temperature T1 is elevated to T2 over one minute to five minutes.

(35) A method for producing a gallium nitride compound semiconductor multilayer structure according to any one of (27) to (34) above, wherein the barrier layer is grown at T2.

(36) A method for producing a gallium nitride compound semiconductor multilayer structure according to (35) above, wherein the barrier is grown at T2, followed by lowering the substrate temperature to T3 at which further growth is performed.

(37) A method for producing a gallium nitride compound semiconductor multilayer structure according to (36) above, wherein T3 is equal to T1.

(38) A method for producing a gallium nitride compound semiconductor multilayer structure according to any one of (26) to (37) above, wherein the step of growing is performed in an atmosphere containing a nitrogen source and a Group III metal source and the step of decomposing or sublimating is performed in an atmosphere containing a nitrogen source but no Group III metal source.

According to the gist of the present invention, the barrier layer included in the multiple quantum well structure for forming the light-emitting layer is contains a dopant, and the well layer is formed from a thick portion and a thin portion. Thus, a gallium nitride compound semiconductor light-emitting device which maintains satisfactory output, and exhibits a reduced operating voltage, can be produced.

Through formation of the thick portion and the thin portion in the well layer by doping the barrier layer with a dopant, blue-shifting of the light emitted from the well layer can be prevented.

BEST MODES FOR CARRYING OUT THE INVENTION

The n-type layer, light-emitting layer, and p-type layer of a gallium nitride compound semiconductor light-emitting device are widely known to be formed from a variety of gallium nitride compound semiconductors represented by formula: $Al_xIn_yGa_{1-x-y}N$ ($0 \leq x \leq 1$; $0 \leq y < 1$; $0 \leq x+y < 1$). No particular limitation is imposed on the gallium nitride compound semiconductor for forming the n-type layer, light-emitting layer, and p-type layer employed in the present invention, and a variety of gallium nitride compound semiconductors represented by formula: $Al_xIn_yGa_{41-x-y}N$ ($0 \leq x \leq 1$; $0 \leq y < 1$; $0 \leq x+y < 1$) may also be employed.

No particular limitation is imposed on the type of the substrate, and there may be employed conventionally known substrate species such as sapphire, SiC, GaP, GaAs, Si, ZnO, and GaN.

In order to form a gallium nitride compound semiconductor on any of the above substrates (excepting a GaN substrate) which are not theoretically lattice-matched with the gallium nitride compound, a low-temperature buffer method (disclosed in, for example, Japanese Patent 3026087 and Japanese Laid-Open Patent Application (kokai) No. 4-297023) and a lattice-mismatch crystal epitaxial growth technique (disclosed in, for example, Japanese Laid-Open Patent Application (kokai) No. 2003-243302), which is called "seeding process (SP)," may be employed. Among these methods, from the viewpoint of productivity and other factors, the SP method is a particularly advantageous lattice-mismatch crystal epitaxial growth technique which can produce AlN crystal film at such a high temperature that enables formation of GaN crystals.

When a lattice-mismatch crystal epitaxial growth technique such as a low-temperature buffer method or an SP method is employed, the gallium nitride compound semiconductor, which is formed on the buffer layer as an undercoat layer, is preferably GaN which is undoped or lightly doped (dopant concentration is about $5 \times 10^{17}$ cm$^{-3}$). The undercoat layer preferably has a thickness of 1 to 20 μm, more preferably 5 to 15 μm.

In the present invention, the well layer included in the multiple quantum well structure for forming the light-emitting layer is formed from a thick portion and a thin portion. It is preferable that the upper surface and the lower surface have depressions and protrusions. As used herein, the term "thick portion" refers to a portion having a thickness not less than an average thickness of the well layer, and the term "thin portion" refers to a portion having a thickness less than an average thickness of the well layer. The term "average thickness" is the arithmetic mean of the largest thickness and the smallest thickness. When the thin portion includes an area that is not covered with a well layer, or has a very thin well layer, the thick portion refers to a portion having a thickness not less than ½ the largest thickness of the well layer, and the thin portion refers to a portion having a thickness less than ½ the largest thickness of the well layer.

Figure 1:
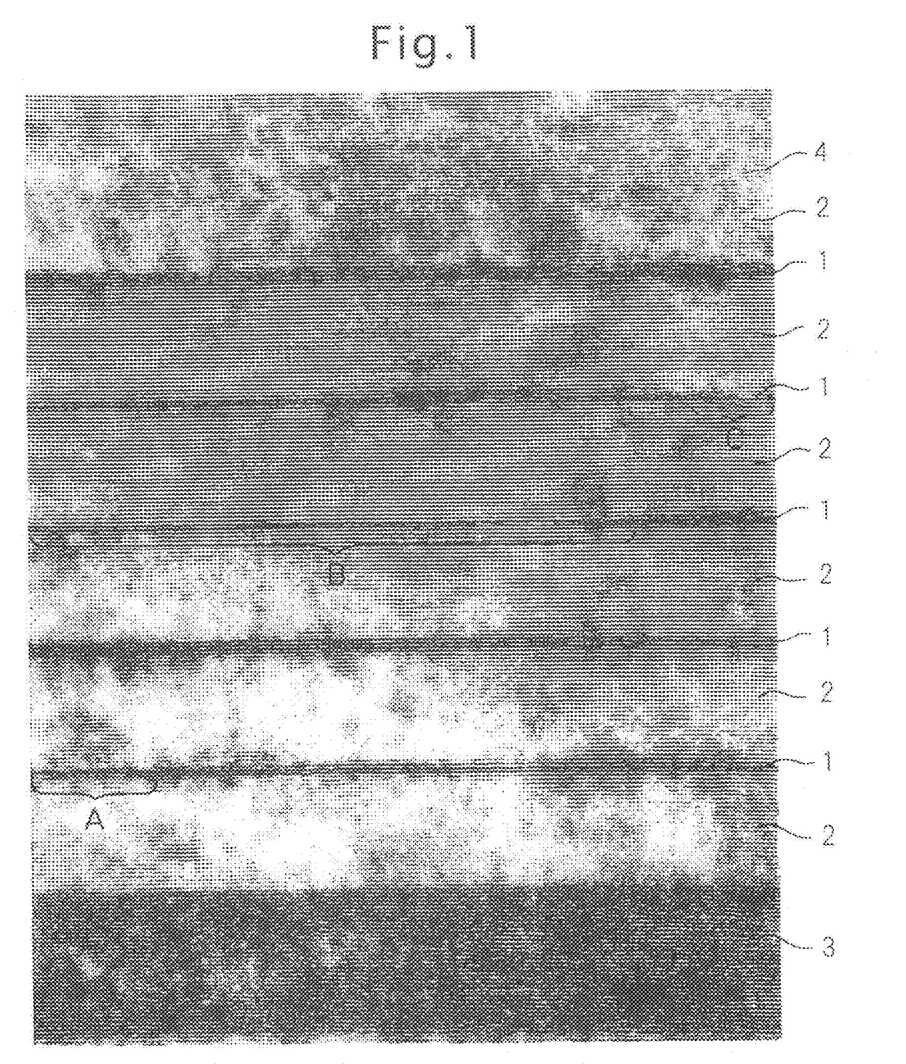
FIG. 1 is an exemplary cross-section TEM photograph of the gallium nitride compound semiconductor multilayer structure fabricated in Example 1.
Figure 2:
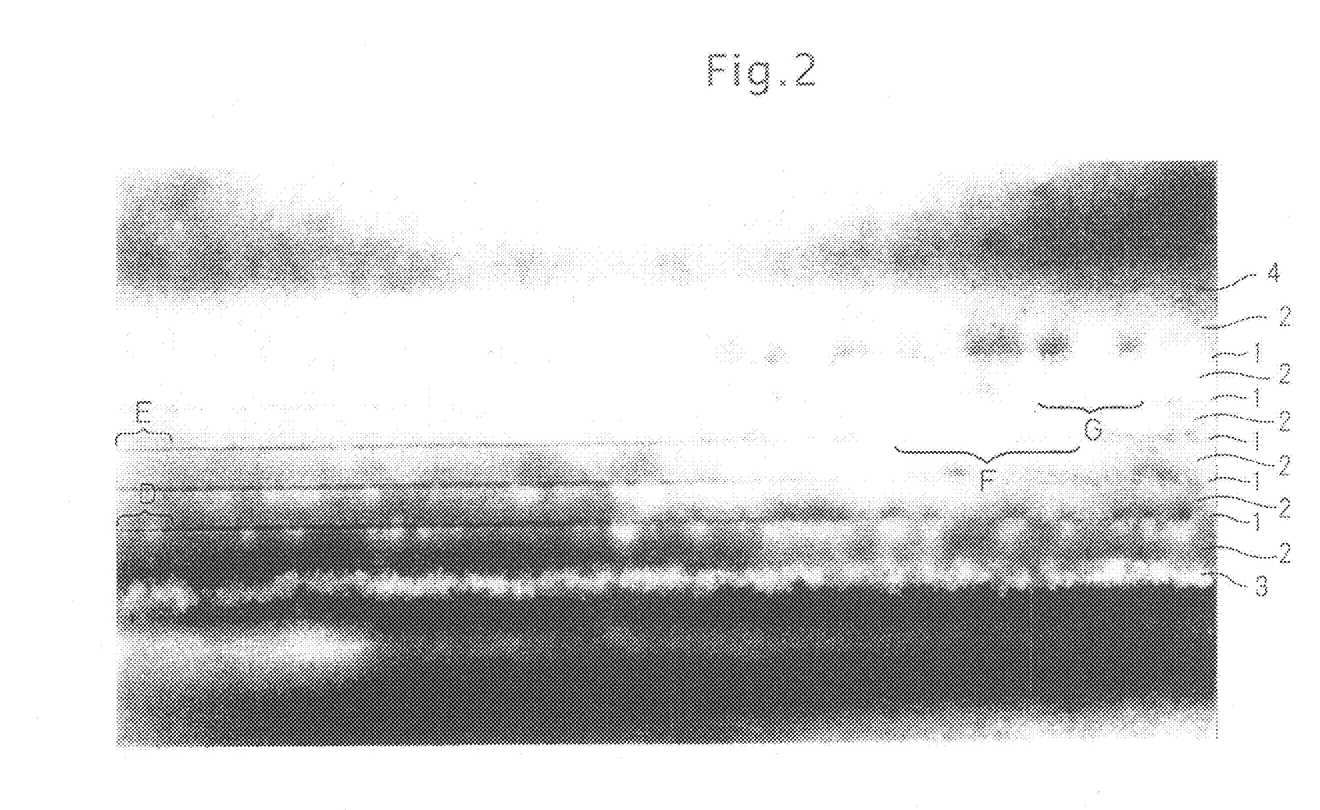
FIG. 2 is another exemplary cross-section TEM photograph of the gallium nitride compound semiconductor multilayer structure fabricated in Example 1.

The thick portion and the thin portion can be determined visually and quantitatively from a TEM cross-section photograph of a gallium nitride compound semiconductor. For example, from a TEM cross-section photograph of the compound semiconductor at a magnification of 500,000 to 2,000,000, the thickness and width of the thick portion or the thin portion can be determined. FIG. 1 shows a TEM cross-section photograph of a semiconductor sample fabricated in Example 1 at a magnification of 2,000,000. In FIG. 1, reference numeral 1 denotes a well layer, and each of A, B, and C denotes a thin portion. Reference numerals 2, 3 and 4 denote a barrier layer, n-type cladding layer and p-type cladding layer, respectively. The width and thickness of a thick portion or a thin portion can be calculated by use of the magnification. FIG. 2 shows a TEM cross-section photograph of the same sample 1 at a magnification of 500,000. In FIG. 2, reference numeral 1 denotes a well layer, and each of D, E, F, and G denotes a thin portion. Reference numerals 2, 3 and 4 denote a barrier layer, n-type cladding layer and p-type cladding layer, respectively. The width and thickness of a thick portion or a thin portion can be calculated by use of the magnification.

The thickness or the width of a thick portion or a thin portion is an arithmetically averaged value obtained in a plurality of observation fields for measurement in a TEM cross-section photograph (e.g., observed in 10 fields, adjacent fields being spaced at a pitch of 10 µm).

The thick portion preferably has a thickness of about 1.5 nm to about 5 nm. When the thickness of the thick portion falls outside the range, emission output is lowered. More preferably, the thickness is 1.5 nm to 3.0 nm. The width of the thick portion is preferably 10 to 5,000 nm, more preferably 100 to 1,000 nm.

The area of the thick portion preferably accounts for 30 to 90% the entire area of the well layer. When the area falls within the range, lowering of operation voltage and maintaining output can be attained. More preferably, the area that is covered with the thick portion is greater than the area that is covered with the thin portion (i.e., accounting for 50% or more the entire active layer). The area ratio of the thick portion and that of the thin portion can be calculated from the width as measured from a cross-section TEM photograph.

The thin portion has a width of 1 to 100 nm, more preferably 5 to 50 nm.

The difference in thickness between the thick portion and the thin portion preferably falls within a range of about 1 to 3 nm. The thickness of the thin portion is preferably less than 1.5 nm.

The well layer may include a thin portion having a thickness of 0. In other words, the well layer may include an area that is not covered with a well layer. However, such an area is preferably narrow in order to prevent lowering of emission output. Thus, the area preferably accounts for 30% or less the entire area of the well layer, more preferably 20% or less, particularly preferably 10% or less. The area ratio can be calculated from the width as measured from a cross-section TEM photograph.

The thick portion and the thin portion in the well layer are preferably formed through doping of the barrier layer with a dopant. Examples of the dopant element include C, Si, Ge, Sn, Pb, O, S, Se, Te, Po, Be, Mg, Ca, Sr, Ba, and Ra. Of these, Si and Ge are preferred, with Si being most preferred.

The dopant concentration is preferably $1 \times 10^{17}$ cm$^{-3}$ to $1 \times 10^{19}$ cm$^{-3}$. When the concentration is lower than $1 \times 10^{17}$ cm$^{-3}$, the formed well layer has a uniform thickness, resulting in difficulty in formation of a thick portion or a thin portion, whereas when the concentration is in excess of $1 \times 10^{19}$ cm$^{-3}$, the well layer cannot emit light. More preferably, the concentration is $2 \times 10^{17}$ cm$^{-3}$ to $5 \times 10^{18}$ cm$^{-3}$. When the concentration falls within the more preferred range, layer thickness distribution of the well layer is suitably controlled, and electrical resistance of the well layer with respect to direct current can be lowered. A dopant concentration falling within a range of $3 \times 10^{17}$ cm$^{-3}$ to $2 \times 10^{18}$ cm$^{-3}$ is particularly preferred.

The barrier layer may have a structure in which a plurality of barrier sub-layers are stacked. In this case, the barrier sub-layer being in contact with the well layer preferably contains a dopant. The layer preferably has a thickness 2.5 nm or more, more preferably 5 nm or more, particularly preferably 7.5 nm or more. When the thickness of the dopant-containing barrier layer being in contact with the well layer is less than 5 Å, formation of a thick portion and a thin portion in the well layer is difficult.

When the barrier layer is formed under the aforementioned conditions, the upper surface and the lower surface of the well layer form depressions and protrusions. Through employment of such a structure in combination with the doped barrier layer, high emission intensity can be attained, and operation voltage can be further lowered. In addition, deterioration due to aging can be prevented.

The barrier layer preferably has a thickness of 7 nm or more, more preferably 14 nm or more. When the barrier layer is excessively thin, formation of a thick portion and a thin portion in the well layer is inhibited, leading to lowering of emission efficiency and deterioration in characteristics due to aging, whereas when the barrier layer is excessively thick, an operating voltage increases and emission becomes weak. Therefore, the barrier layer preferably has a thickness of 50 nm or less.

The repetition of stacking in the multiple quantum well structure is preferably about 3 to about 10 times, more preferably about 3 to about 6 times. All the well layers included in the multiple quantum well structure do not necessarily have a thick portion and thin portion, and the dimensions and area proportion of each of the thick portions and the thin portions may vary layer by layer.

The well layer is preferably formed of a gallium nitride compound semiconductor containing In, because the In-containing gallium nitride compound semiconductor is of a crystal system for readily attaining a structure having a thick portion and a thin portion. In addition, the In-containing gallium nitride compound semiconductor can emit high-intensity light in a blue light wavelength region.

When the well layer is formed of an In-containing gallium nitride compound semiconductor, the upper surface of the well layer is preferably covered with a thin layer containing no In. By virtue of the thin layer, decomposition/sublimation of In contained in the well layer can be suppressed, whereby emission wavelength can be consistently controlled, which is preferred.

The barrier layer may be formed of GaN, AlGaN, and InGaN which has an In content lower than that of InGaN forming a well layer. Among them, GaN is preferred.

The n-type layer generally has a thickness of about 1 to about 10 µm, preferably about 2 to about 5 µm. The n-type layer is formed of an n-type contact layer for forming a negative electrode and an n-type cladding layer which has a bandgap larger than that of a light-emitting layer and which is in contact with the light-emitting layer. The n-type contact layer may also serve as the n-type cladding layer. The n-type contact layer is preferably doped with Si or Ge at high concentration. The thus-doped n-type layer preferably has a carrier concentration which is controlled to about $5 \times 10^{18}$ cm$^{-3}$ to about $2 \times 10^{19}$ cm$^{-3}$.

The n-type cladding layer may be formed from a semiconductor such as AlGaN, GaN, or InGaN. Needless to say, when InGaN is employed, the InGaN preferably has such a composition as to have a bandgap greater than that of InGaN forming the light-emitting layer. The carrier concentration of the n-type cladding layer may be equal to or greater or smaller than that of the n-type contact layer. The n-type cladding layer preferably has a surface having high flatness by appropriately regulating growth conditions including growth rate, growth temperature, growth pressure, and dopant concentration, so as to attain high crystallinity of the light-emitting layer formed thereon.

The n-type cladding layer may be formed by alternately stacking layers repeatedly, each layer having a specific composition and lattice constants. In this case, in addition to the composition, the amount of dopant, film thickness, etc. of the layer stacked may be modified.

The p-type layer generally has a thickness of 0.01 to 1 μm and is formed of a p-type cladding layer which is in contact with the light-emitting layer and a p-type contact layer for forming a positive electrode. The p-type contact layer may also serve as the p-type cladding layer. The p-type cladding layer is formed from a semiconductor such as GaN or AlGaN and doped with Mg serving as a p-type dopant. In order to prevent overflow of electrons, the p-type cladding layer is preferably formed from a material having a bandgap greater than that of the material for forming the light-emitting layer. Furthermore, in order to effectively inject carriers to the light-emitting layer, the p-type cladding layer preferably has high carrier concentration.

Similar to the n-type cladding layer, the p-type cladding layer may be formed by alternately stacking layers repeatedly, each layer having a specific composition and lattice constants. In this case, in addition to the composition, the amount of dopant, film thickness, etc. of the layer stacked may be modified.

The p-type contact layer may be formed from a semiconductor such as GaN, AlGaN, or InGaN, and is doped with Mg serving as an impurity element. When removed from a reactor, the as-removed Mg-doped gallium nitride compound semiconductor generally exhibits high electric resistance. However, the Mg-doped compound semiconductor exhibits p-type conductivity through activation such as annealing, electron-beam irradiation, or microwave irradiation.

The p-type contact layer may be formed from boron phosphide doped with a p-type impurity element, which exhibits p-type conductivity even though the aforementioned treatment for attaining p-type conductivity is not performed.

No particular limitation is imposed on the method for growing the gallium nitride compound semiconductor for forming the aforementioned n-type layer, light-emitting layer, and p-type layer, and any of widely known methods such as MBE, MOCVD, and HVPE may be employed under widely known conditions. Of these, MOCVD is preferred.

Regarding sources for forming the semiconductor, ammonia, hydrazine, an azide, or a similar compound may be used as a nitrogen source. Examples of the Group III organometallic source which may be employed in the invention include trimethylgallium (TMGa), triethylgallium (TEGa), trimethylindium (TMIn), and trimethylaluminum (TMAl). Examples of employable dopant sources include silane, disilane, germane, organic germanium sources, biscyclopentadienylmagnesium ($Cp_2Mg$), other organometallic compounds, and hydrides. Nitrogen or hydrogen may be employed as a carrier gas.

The In-containing well layer is preferably grown at a substrate temperature of 650 to 900° C. When the substrate temperature is 650° C. or lower, a well layer of high crystallinity cannot be formed, whereas when the substrate temperature is 900° C. or higher, the amount of In incorporated into the well layer decreases, thereby failing to fabricating a light-emitting device which emits light of intended wavelength.

As described above, when the well layer contains In, a thin layer containing no In is preferably formed on the surface of the well layer. In this case, after completion of growth of an In-containing gallium nitride compound semiconductor, a gallium nitride compound semiconductor is grown at the same substrate temperature while supply of the In source is stopped.

As mentioned before, the thick portion and the thin portion in the well layer are preferably formed through doping of the barrier layer with a dopant. However, the thick portion and the thin portion in the well layer are also formed by growing a gallium nitride compound semiconductor to a predetermined thickness and decomposing or sublimating a portion of the grown semiconductor.

Namely, after the In-containing gallium nitride compound semiconductor has been grown to a predetermined thickness by continuously supplying a Group III metal (containing In) source and a nitrogen source, supply of the Group III metal source is stopped. The substrate temperature is maintained or elevated under the above conditions, thereby decomposing or sublimating a portion of the compound semiconductor. The carrier gas is preferably nitrogen. Decomposition or sublimation is preferably performed, when the substrate temperature has been elevated from the above growth temperature to 700 to 1,000° C. or while the substrate temperature is elevated.

The barrier layer is preferably grown at a substrate temperature higher than that employed for the growth of the well layer. The substrate temperature is preferably about 700 to about 1,000° C. When the temperature at which the well layer is grown is represented by T1 and the temperature at which the barrier layer is grown is represented by T2, T1 and T2 satisfy the relationship: $T1 \leq T2$. During temperature elevation after growth of the well layer from T1 to T2, supply of the Group III source is stopped while the nitrogen source and a nitrogen-containing carrier gas are supplied continuously, whereby a thick portion and a thin portion are effectively formed in the well layer. During the course of the above procedure, change of carrier gas is not needed. If the carrier gas is changed to hydrogen, the wavelength of emitted light is blue-shifted. Since such variation in wavelength is difficult to control reliably, the variation reduces device productivity.

The rate of temperature elevation from T1 to T2 is preferably about 1 to about 100° C./min, more preferably about 5 to about 50° C./min. The time required for temperature elevation from T1 to T2 is preferably about 30 sec to about 10 min, more preferably about 1 min to about 5 min.

The growth of the barrier layer may include a plurality of steps which are performed at different growth temperatures. For example, a barrier layer having a predetermined thickness is formed at T2 on a well layer having a thick portion and a thin portion, followed by forming thereon another barrier layer at a growth temperature T3. When T3 is lower than T2, deterioration of characteristics caused by aging can be prevented, which is preferred. T3 may be equal to T1.

Negative electrodes of a variety of compositions and structures have been widely known, and no particular limitation is imposed on the negative electrode which may be employed in the present invention. Examples of employable contact materials for the negative electrode which is to be in contact with an n-type contact layer include Al, Ti, Ni, Au, Cr, W, and V. Needless to say, the negative electrode may have a multilayer structure in its entirety, thereby imparting the electrode with a bonding property and other properties.

Positive electrodes of a variety of compositions and structures have been widely known, and no particular limitation is imposed on the positive electrode which may be employed in the present invention.

Examples of light-permeable positive electrode materials include Pt, Pd, Au, Cr, Ni, Cu, and Co. Through partial oxidation of the positive electrode, light permeability is known to be enhanced. Examples of employable reflection-type positive electrode materials include the aforementioned materials, Rh, Ag, and Al.

The positive electrode may be formed through a method such as sputtering or vacuum vapor deposition. Particularly when sputtering is employed under appropriately controlled sputtering conditions, ohmic contact can be established even though the electrode film is not annealed after formation of the film, which is preferred.

The light-emitting device may have a flip-chip-type structure including a reflection-type positive electrode or a face-up-type structure including an light-permeable positive electrode or a lattice-like or comb-like positive electrode.

According to the light-emitting layer of the present invention including a thick portion and a thin portion, an interface between the well layer and a barrier layer composed of a material different from that of the well layer in a boundary area between the thick portion and the thin portion is at a slant to the substrate surface. Therefore, the amount of light extracted in the direction normal to the substrate surface increases. Particularly when the light-emitting device has a flip-chip-type structure including a reflection-type electrode, emission intensity is further enhanced.

An operating voltage of a light-emitting device obtained by using the inventive gallium nitride compound semiconductor multilayer structure may be freely lowered to some degree. However, when it is lowered very largely, a light-emission output is also lowered together. The operating voltage, at which the light-emission output is not lowered, is 2.5 V or more at a current of 20 mA. More preferably, the operating voltage is 2.9 V or more. It is necessary that the operating voltage is 3.5 V or less, because a very high operating voltage is disadvantageous when a light-emitting device is incorporated in an equipment.

A take-off voltage, at which a current increases rapidly in a current-voltage curve, is a diode characteristic. The take-off voltage of a light-emitting device obtained by using the inventive gallium nitride compound semiconductor multilayer structure may be lowered. However, also in regard to the take-off voltage, when it is lowered very largely, a light-emission output is also lowered. The take-off voltage, at which the light-emission output is not lowered, is 2.3 V or more at a current of 20 mA. More preferably, the take-off voltage is 2.5 V or more. But it is necessary that the take-off voltage is 3.2 V or less, because a very high take-off voltage is disadvantageous when a light-emitting device is incorporated in an equipment.

The inventive gallium nitride compound semiconductor multilayer structure is employed in, for example, a light-emitting diode (LED) and a laser diode (LD).

A semiconductor light-emitting device is fabricated from the inventive gallium nitride compound semiconductor multilayer structure, and through conventional means well known in the art, a transparent cover was attached to the semiconductor light-emitting device, thereby fabricating a lamp. Also, a phosphor-containing cover was attached to the semiconductor light-emitting device, thereby fabricating a white light lamp.

After all, a semiconductor light-emitting device having a high light-emission output may be fabricated from the inventive gallium nitride compound semiconductor multilayer structure. A very bright LED lamp may be fabricated from the inventive gallium nitride compound semiconductor multilayer structure by the above-mentioned technique. Further, an electronic machine such as a portable telephone, a display and panels, in which a chip fabricated by the above-mentioned technique is incorporated, and machines such as a car, a computer and a game machine, in which the electronic machine is incorporated, may be operated at low electric power and may attain a high performance. Specially, apparatuses such as a portable telephone, a game machine and a car part, which are operated by a battery, may attain an effect of energy-saving.

EXAMPLES

The present invention will next be described in more detail by way of examples, which should not be construed as limiting the invention.

Example 1

Figure 3:
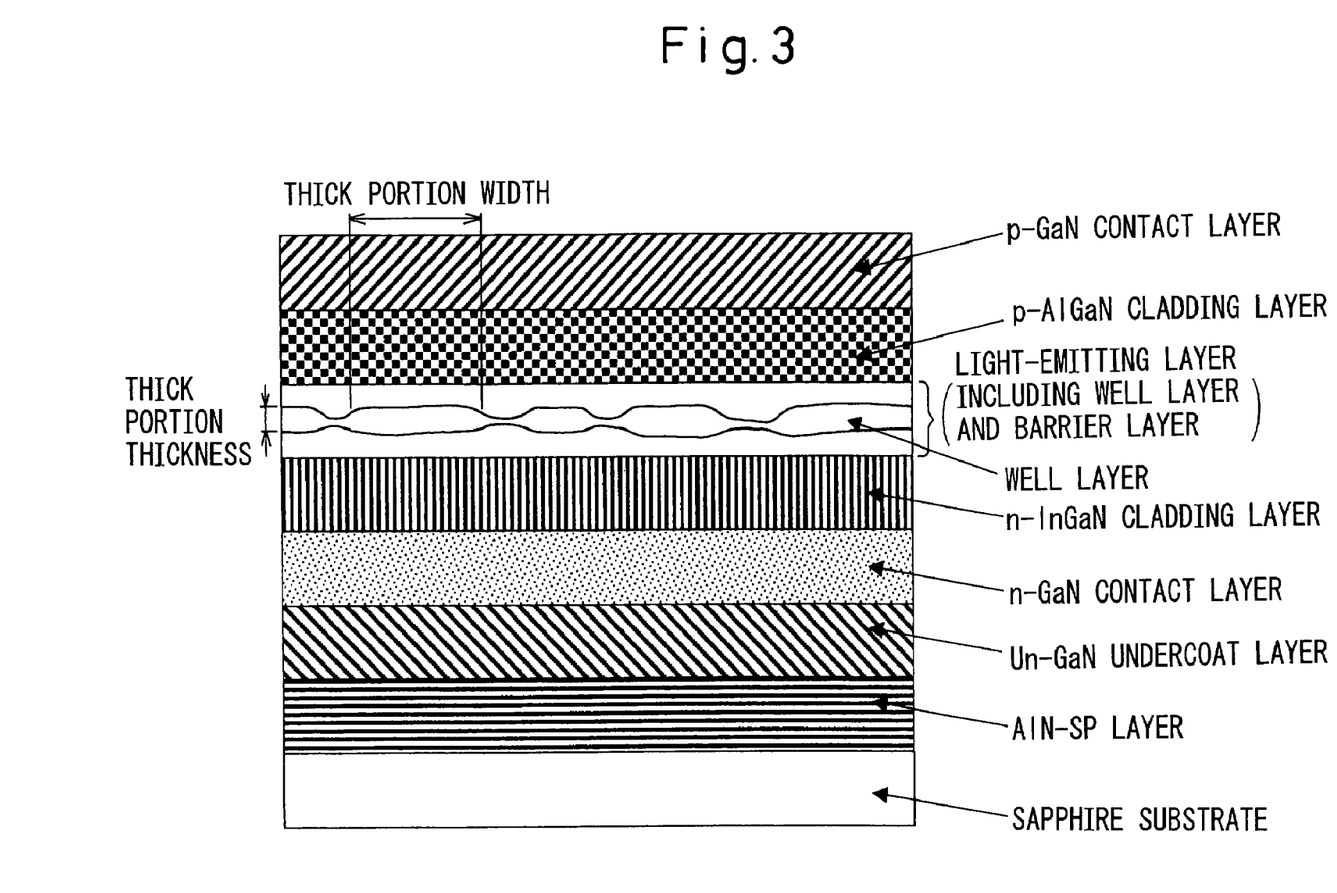
FIG. 3 is a schematic view of a cross-section of the gallium nitride compound semiconductor multilayer structure fabricated in Example 1~3.

FIG. 3 schematically shows a gallium nitride compound semiconductor multilayer structure for producing a semiconductor light-emitting device which structure was fabricated in Example 1 (configuration of well layers and barrier layers in the light-emitting layer being schematically represented). As shown in FIG. 3, an SP layer formed of AlN is stacked on a sapphire substrate having a c-plane through a lattice-mismatch crystal epitaxial growth method. On the SP layer, the following layers are sequentially formed: an undoped GaN undercoat layer (thickness: 2 μm); a highly-Si-doped GaN contact layer (electron concentration: $1\times10^{19}$ cm$^{-3}$, thickness: 2 μm); an $In_{0.1}Ga_{0.9}N$ cladding layer (electron concentration: $1\times10^{18}$ cm$^{-3}$, thickness: 12.5 nm); a light-emitting layer of a multiple quantum well structure including Si-doped ($1\times10^{18}$ cm$^{-3}$) GaN barrier layers (6 layers, thickness of each layer: 16 nm) and well layers (5 layers, each layer being formed of undoped $In_{0.2}Ga_{0.8}N$ layer (thickness: 2.5 nm) and a GaN layer (thickness: 0 to 0.5 nm)); an Mg-doped p-type $Al_{0.07}Ga_{0.93}N$ cladding layer (thickness: 10 nm); and an Mg-doped p-type GaN contact layer (hole concentration: $8\times10^{17}$ cm$^{-3}$, thickness: 0.1 μm).

The aforementioned gallium nitride compound semiconductor multilayer structure was fabricated by means of MOCVD through the following procedure.

Firstly, a sapphire substrate was placed in a stainless reactor furnace that can heat a plurality of substrates by means of a carbon susceptor heated by an induction heater. The susceptor has a mechanism such that the susceptor itself is rotatable and rotates the substrates. The sapphire substrate was placed on the carbon susceptor for heating, the operation being performed in a nitrogen-substituted glove box. After introduction of the substrate, the reactor furnace was purged with nitrogen.

After passage of nitrogen for 8 minutes, the substrate temperature was elevated, over 10 minutes, to 600° C. by means of the induction heater, and the pressure inside the furnace was adjusted to 150 mbar (15 kPa). While the substrate temperature was maintained at 600° C., the substrate surface was thermally cleaned by allowing the substrate to stand for 2 minutes under flow of hydrogen and nitrogen.

After completion of thermal cleaning, a valve of a nitrogen carrier gas feeding pipe was closed, and only hydrogen was supplied to the reactor furnace.

After the carrier gas was changed to hydrogen, the substrate temperature was elevated to 1,180° C. After confirming that a constant temperature of 1,180° C. was attained, a gas containing TMAl vapor was supplied to the reactor furnace by opening the corresponding valve. The supplied TMAl was caused to react with N atoms which had been released through decomposition of deposits on an inner wall of the reactor furnace, thereby depositing AlN on the sapphire substrate.

After supply of TMAl for 8 minutes and 30 seconds, the valve was closed to stop supply of the gas containing TMAl vapor to the reactor furnace. The conditions were maintained for 4 minutes, whereby the TMAl vapor remaining in the furnace was completely removed. Subsequently, ammonia gas was supplied to the furnace by opening the corresponding valve.

Four minutes after the start of supply of ammonia gas, the susceptor temperature was lowered to 1,040° C. under ammonia flow. During lowering of the susceptor temperature, the flow rate of TMGa was regulated by means of a flow controller.

After confirmation that the susceptor temperature was lowered to 1,040° C. and the susceptor maintained a constant temperature of 1,040° C., TMGa was supplied into the furnace by opening the corresponding valve, so as to grow undoped GaN. The growth was performed for about one hour, thereby forming the aforementioned GaN layer.

Thus, an undoped GaN undercoat layer having a thickness of 2 μm was formed.

On the undoped GaN undercoat layer, a highly-Si-doped n-type GaN layer was grown. After completion of growth of the undoped GaN undercoat layer, supply of TMGa into the furnace was interrupted for one minute, and the flow rate of $SiH_4$ was adjusted during the interruption of flow. The flow rate of interest had been predetermined in advance, and the flow was regulated so as to control the electron concentration of the highly-Si-doped GaN layer to $1 \times 10^{19}$ $cm^{-3}$. Ammonia was supplied continuously into the furnace, and the flow rate was unchanged. During the above interruption of TMGa supply for one minute, the susceptor temperature was elevated from 1,040° C. to 1,060° C.

After the interruption of TMGa supply for one minute, TMGa and $SiH_4$ were supplied, and the growth was performed for one hour, thereby forming a highly-Si-doped GaN contact layer having a thickness of 2 μm.

After growth of the highly-Si-doped GaN contact layer, supply of TMGa and $SiH_4$ into the furnace was stopped by closing the corresponding valves. The carrier gas was changed from hydrogen to nitrogen through valve operation, while ammonia was supplied continuously. Thereafter, the substrate temperature was lowered from 1,060° C. to 730° C.

During the lowering of the temperature inside the furnace, the flow rate of $SiH_4$ was modified. The flow rate of interest had been predetermined in advance, and the flow was regulated so as to control the electron concentration of the Si-doped InGaN cladding layer to $1 \times 10^{18}$ $cm^{-3}$. Ammonia was supplied continuously into the furnace, and the flow rate was unchanged.

Subsequently, after the conditions in the furnace had been stabilized, TMIn, TEGa, and $SiH_4$ were supplied to the furnace by simultaneously opening the corresponding valves. The supplying was continued for a predetermined period of time, thereby forming an Si-doped $In_{0.1}Ga_{0.9}N$ cladding layer having a thickness of 12.5 nm. Supply of the sources (TMIn, TEGa, and $SiH_4$) was stopped by closing the corresponding valves.

After completion of growth of the Si-doped $In_{0.1}Ga_{0.9}N$ cladding layer, the susceptor temperature was elevated to 930° C. After the susceptor was held at a constant temperature of 930° C., TEGa and $SiH_4$ were supplied to the furnace by opening the corresponding valves while substrate temperature, pressure inside the furnace, flow rate of ammonia and carrier gas, and the type of carrier gas were maintained constant. The growth was performed for a predetermined period of time at a susceptor temperature of 930° C. Subsequently, the susceptor temperature was lowered to 730° C., and TEGa and $SiH_4$ were supplied so as to perform growth. Supply of TEGa and $SiH_4$ were stopped by closing the corresponding valves, thereby terminating the growth of a GaN barrier layer. As a result, a GaN barrier layer having a total thickness of 16 nm was formed.

After completion of growth of the GaN barrier layer, supply of TEGa was stopped for 30 seconds. Subsequently, TEGa and TMIn were supplied to the furnace by opening the corresponding valves while substrate temperature, pressure inside the furnace, flow rate of ammonia and carrier gas, and the type of carrier gas were maintained constant. TEGa and TMIn were supplied for a predetermined period of time, and supply of TMIn was stopped by closing the corresponding valve, thereby terminating the growth of an $In_{0.2}Ga_{0.8}N$ well layer. In this instance, an $In_{0.2}Ga_{0.8}N$ layer having a thickness of 2.5 nm was formed.

After completion of the growth of the $In_{0.2}Ga_{0.8}N$ layer, TEGa and $SiH_4$ were supplied continuously to the furnace for a predetermined period of time, thereby forming, on the InGaN layer, an Si-doped GaN thin film for preventing release of In. Then, supply of TEGa and $SiH_4$ was stopped.

The aforementioned procedure was repeated five times, to thereby form five Si-doped GaN barrier layers and five $In_{0.2}Ga_{0.8}N$ well layers. Finally, another Si-doped GaN barrier layer was formed, to thereby fabricate a light-emitting layer having a multiple quantum well structure.

On the outermost Si-doped GaN barrier layer of the light-emitting layer, an Mg-doped p-type $Al_{0.07}Ga_{0.93}N$ cladding layer was formed.

After completion of the growth of the last Si-doped GaN barrier layer by stopping the supply of TEGa and $SiH_4$, the substrate temperature was elevated to 1,020° C. The carrier gas was changed to hydrogen, and the pressure inside the furnace was adjusted to 150 mbar (15 kPa). After the pressure inside the furnace became constant, sources (TMGa, TMAl, and $Cp_2Mg$) were supplied to the furnace by opening the corresponding valves. The growth was performed for about three minutes, after which supply of TEGa and TMAl was stopped, thereby terminating the growth of an Mg-doped p-type $Al_{0.07}Ga_{0.93}N$ cladding layer. As a result, an Mg-doped p-type $Al_{0.07}Ga_{0.93}$ cladding layer having a thickness of 10 nm was formed.

On the Mg-doped p-type $Al_{0.07}Ga_{0.93}N$ cladding layer, an Mg-doped p-type GaN contact layer was formed.

After completion of the growth of the Mg-doped $Al_{0.07}Ga_{0.93}N$ cladding layer by stopping supply of TMGa, TMAl, and $Cp_2Mg$, the pressure inside the furnace was adjusted to 200 mbar (20 kPa). After the pressure inside the furnace became constant, sources (TMGa and $Cp_2Mg$) were supplied to the furnace by opening the corresponding valves. The flow rate of $Cp_2Mg$ had been predetermined in advance, and the flow was regulated so as to control the hole concentration of the Mg-doped GaN contact layer to $8 \times 10^{17}$ $cm^{-3}$. Thereafter, the growth was performed for about four minutes, after which supply of TMGa and $Cp_2Mg$ was stopped, thereby terminating the growth of the Mg-doped GaN layer. As a result, the Mg-doped GaN contact layer was formed to a thickness of 0.1 μm.

After completion of the growth of the Mg-doped GaN contact layer, the electricity supply to the induction heater was stopped, and the substrate temperature was lowered to room temperature over 20 minutes. During the process of lowering the temperature, the atmosphere in the reactor furnace was exclusively nitrogen. When the substrate temperature was confirmed to have been lowered to room temperature, the thus-fabricated gallium nitride compound semiconductor multilayer structure was removed to the atmosphere.

Through the above-described procedure, the gallium nitride compound semiconductor multilayer structure for producing a semiconductor light-emitting device was fabricated. Even though the Mg-doped GaN layer had not undergone annealing for activating the p-type carrier, the GaN layer exhibited p-type conductivity.

By use of the aforementioned gallium nitride compound semiconductor multilayer structure, a light-emitting diode, which is a type of semiconductor light-emitting device, was fabricated.

On the surface of the p-type GaN contact layer of the thus-fabricated gallium nitride compound semiconductor multilayer structure, there was formed a reflection-type positive electrode having a structure in which Pt, Rh, and Au were successively formed on the contact layer side through a conventional photolithographic method.

Figure 4:
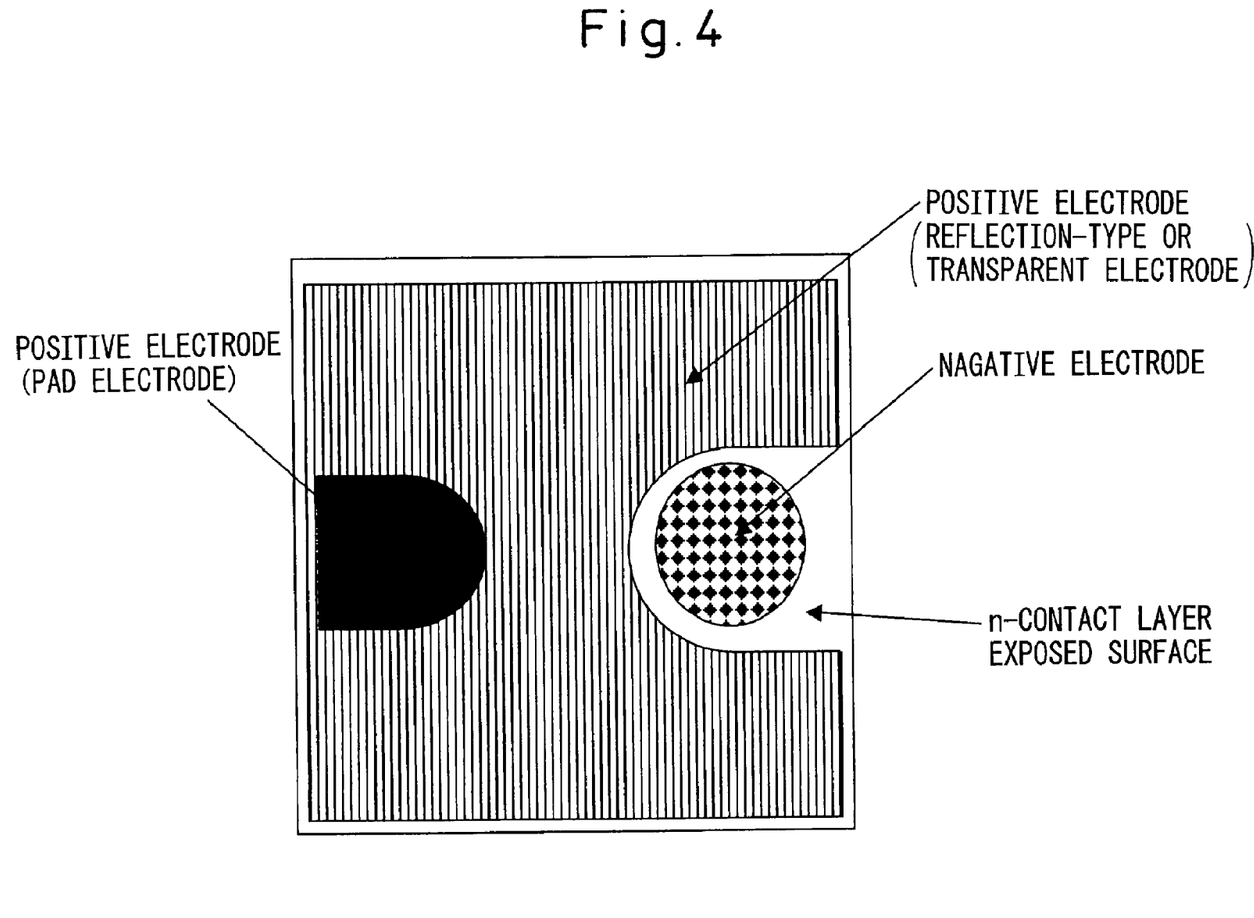
FIG. 4 is a schematic view of an electrode configuration of the light-emitting diode fabricated in Example 1~3.

Subsequently, the aforementioned gallium nitride compound semiconductor multilayer structure was dry-etched so as to expose a negative electrode portion of the highly-Si-doped n-type GaN contact layer. Ti and Al were successively formed on the exposed portion of the contact layer, thereby forming a negative electrode. Through these operations, electrodes of a shape shown in FIG. 4 were fabricated.

The backside of the sapphire substrate of the gallium nitride compound semiconductor multilayer structure which had been provided with the positive electrode and the negative electrode in the above manner was ground and polished, thereby providing a mirror surface. Subsequently, the gallium nitride compound semiconductor multilayer structure was cut into square (350 μm×350 μm) chips, and each chip was affixed on a sub-mount such that the electrodes were in contact with the sub-mount. The thus-formed sub-mounted chip was placed on a lead frame and wired to the lead frame with gold wire, thereby fabricating a light-emitting device.

When an operation current was applied to the positive electrode and the negative electrode of the thus-fabricated light-emitting diode in a forward direction, the diode exhibited a forward voltage of 3.0 V at a current of 20 mA, an emission wavelength of 455 nm, and an emission output of 10 mW. Such characteristics of the light-emitting diode can be attained without variation among light-emitting diodes cut and produced from virtually the entirety of the above-fabricated gallium nitride compound semiconductor multilayer structure.

The thus-fabricated gallium nitride compound semiconductor multilayer structure was observed under a cross-section TEM, and FIGS. 1 and 2 show photographs thereof (magnification: 2,000,000 (FIG. 1) and 500,000 (FIG. 2)).

As shown in FIGS. 1 and 2, each well layer is identified as being formed of a thick portion and a thin portion and the upper surface and the lower surface have depressions and protrusions.

The observed thick portion was found to have a thickness of 2.5 nm and a width of 50 nm, and the observed thin portion was found to have a width of about 5 nm and a thickness of 1 nm or less.

The barrier layers were found to have a thickness of 16 nm. Each barrier layer filled up the depressions in the each well layer.

Comparative Example 1

In Comparative Example 1, the procedure of Example 1 was repeated, except that a different light-emitting layer was employed, to thereby fabricate a gallium nitride compound semiconductor multilayer structure of the same configuration. The light-emitting layer of Comparative Example 1 is different from that of Example 1 in that an Si-non-doped barrier layer is employed and that a well layer having a uniform thickness and a barrier layer having a uniform thickness were repeatedly stacked.

The initial steps to the step of forming an InGaN cladding layer were performed in a manner similar to that employed in Example 1.

After completion of growth of the Si-doped $In_{0.1}Ga_{0.9}N$ cladding layer, the susceptor temperature was elevated to 930° C. After the susceptor was held at a constant temperature of 930° C., TEGa was supplied to the furnace by opening the corresponding valve while substrate temperature, pressure inside the furnace, flow rate of carrier gas, and the type of carrier gas were maintained constant. The growth was performed for a predetermined period of time at a susceptor temperature of 930° C. Subsequently, the susceptor temperature was lowered to 730° C., and TEGa was supplied so as to perform growth. Supply of TEGa was stopped by closing the corresponding valve, thereby terminating the growth of a GaN barrier layer. As a result, an undoped GaN barrier layer having a total thickness of 16 nm was formed.

After completion of growth of the undoped GaN barrier layer, supply of TEGa was stopped for 30 seconds. Subsequently, TEGa and TMIn were supplied to the furnace by opening the corresponding valves while substrate temperature, pressure inside the furnace, flow rate of carrier gas, and the type of carrier gas were maintained constant. TEGa and TMIn were supplied for a predetermined period of time, and supply of TEGa and TMIn was stopped by closing the corresponding valve, thereby terminating the growth of an $In_{0.2}Ga_{0.8}N$ layer. In this instance, an $In_{0.2}Ga_{0.8}N$ layer having a thickness of 2.5 nm was formed.

After completion of the growth of the $In_{0.2}Ga_{0.8}N$ layer, TEGa was supplied continuously to the furnace for a predetermined period of time, thereby forming, on the InGaN layer, a GaN thin film for preventing release of In.

The aforementioned procedure was repeated five times, to thereby form a multilayer structure including five undoped GaN barrier layers and five $In_{0.2}Ga_{0.8}N$ well layers. Finally, another undoped GaN barrier layer was formed, to thereby fabricate a light-emitting layer having a multiple quantum well structure.

Subsequently, an Mg-doped p-type $Al_{0.07}Ga_{0.93}N$ cladding layer and an Mg-doped p-type GaN layer were formed through the same procedure as employed in Example 1.

In a manner similar to that of Example 1, the light-emitting diode fabricated from the gallium nitride compound semiconductor multilayer structure was evaluated. As a result, the diode exhibited a forward voltage of 3.9 V at a current of 20 mA, an emission wavelength of 455 nm, and an emission output of 8.5 mW.

Figure 5:
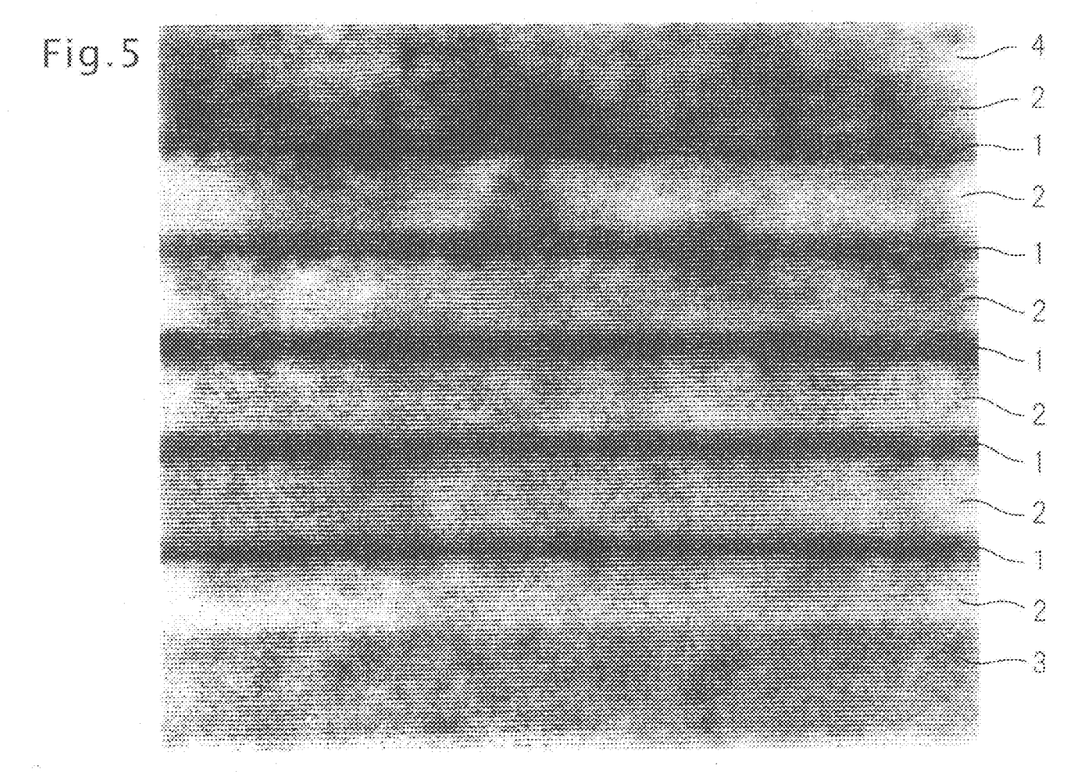
FIG. 5 is an exemplary cross-section TEM photograph of the gallium nitride compound semiconductor multilayer structure fabricated in Comparative Example 1.
Figure 6:
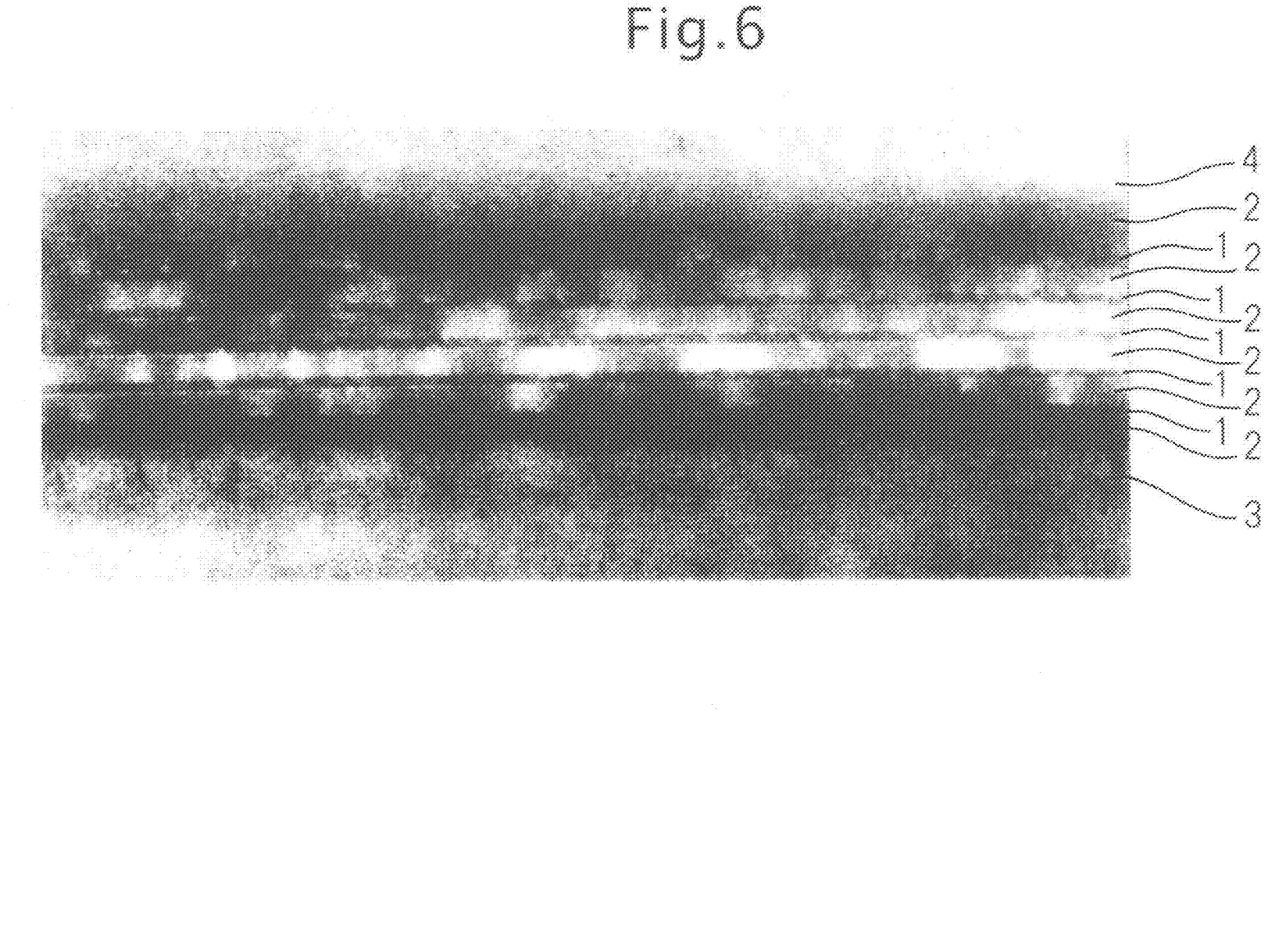
FIG. 6 is another exemplary cross-section TEM photograph of the gallium nitride compound semiconductor multilayer structure fabricated in Comparative Example 1.

The thus-fabricated gallium nitride compound semiconductor multilayer structure was observed under a cross-section TEM, and FIGS. 5 and 6 show photographs thereof (magnification: 2,000,000 (FIG. 5) and 500,000 (FIG. 6)). In these figures, reference numerals 1, 2, 3, and 4 denote a well layer, a barrier layer, n-type cladding layer and a p-type cladding layer, respectively. As shown in FIGS. 5 and 6, each well layer has a virtually uniform thickness of about 2.5 nm, and no position-dependent variation in thickness was found.

Example 2

The procedure of Example 2 for fabricating a gallium nitride compound semiconductor multilayer structure was different from that of Example 1 in the following. Specifically, in Example 2, TEGa and GeH$_4$ were supplied during the step of growing a barrier layer and a GaN thin layer composing a well layer, and the barrier layer and the GaN thin layer composing a well layer were formed of a Ge-doped GaN layer. The flow rate of GeH$_4$ was regulated so as to adjust the Ge dopant concentration to $1 \times 10^{18}$ cm$^{-3}$.

In a manner similar to Example 1, a positive electrode and a negative electrode were provided on the thus-obtained gallium nitride compound semiconductor multilayer structure. The positive electrode had a structure in which a transparent electrode (Au and NiO) and a pad electrode (Ti, Au, Al, and Au) were successively formed on the p-type GaN contact layer side.

In a manner similar to that of Example 1, the fabricated light-emitting diode was evaluated. As a result, the diode exhibited a forward voltage of 3.0 V at a current of 20 mA, an emission wavelength of 455 nm, and an emission output of 5 mW. Such characteristics of the light-emitting diode can be attained without variation among light-emitting diodes cut and produced from virtually the entirety of the above-fabricated gallium nitride compound semiconductor multilayer structure. Through observation of a cross-section of the light-emitting diode under a TEM, each well layer was found to be formed of a thick portion and a thin portion.

Comparative Example 2

In Comparative Example 2, a light-emitting diode having the same electrode structure as employed in the diode of Example 2 was fabricated by use of the gallium nitride compound semiconductor multilayer structure fabricated in Comparative Example 1.

In a manner similar to that of Example 1, the fabricated light-emitting diode was evaluated. As a result, the diode exhibited a forward voltage of 3.9 V at a current of 20 mA, an emission wavelength of 455 nm, and an emission output of 5 mW.

Example 3

In this example, a gallium nitride compound semiconductor multilayer structure was fabricated as follows.

An SP layer formed of AlN is stacked on a sapphire substrate having a c-plane through a lattice-mismatch crystal epitaxial growth method. On the SP layer, the following layers are sequentially formed: an undoped GaN undercoat layer (thickness: 8 μm); a n-GaN contact layer in which a highly-Ge-doped layer and a lowly-Ge-doped layer is alternately stacked 100 times (average electron concentration: $5 \times 10^{18}$ cm$^{-3}$, thickness: 4 μm); an n-In$_{0.1}$Ga$_{0.9}$N cladding layer (electron concentration: $1 \times 10^{18}$ cm$^{-3}$, thickness: 180 Å); a light-emitting layer of a multiple quantum well structure including Si-doped GaN barrier layers (6 layers, Si concentration: $8 \times 10^{17}$ cm$^{-3}$, thickness of each layer: 160 Å) and well layers (5 layers, each layer being formed undoped In$_{0.2}$Ga$_{0.8}$N layer (thickness: 25 Å) and a GaN layer (thickness: 0 to 5 Å)); an Mg-doped p-type Al$_{0.07}$Ga$_{0.93}$N cladding layer (thickness: 100 Å); and an Mg-doped p-GaN contact layer (hole concentration: $8 \times 10^{17}$ cm$^{-3}$, thickness: 0.1 μm).

The aforementioned gallium nitride compound semiconductor multilayer structure was fabricated by means of MOCVD through the procedure similar to that of Example 1.

Next, by use of the aforementioned gallium nitride compound semiconductor multilayer structure, a light-emitting diode, which is a type of semiconductor light-emitting device, was fabricated through the following procedure.

On the surface of the p-type GaN contact layer of the thus-fabricated gallium nitride compound semiconductor multilayer structure, there was formed a transparent-type positive electrode having a structure in which Pt and Au were successively formed on the contact layer side, through a conventional photolithographic method. Then, on the positive electrode, there was formed a pad electrode having a structure in which Ti, Au, Al and Au were successively formed on the positive electrode side Subsequently, the gallium nitride compound semiconductor multilayer structure was dry-etched so as to expose a negative electrode portion of the n-type GaN contact layer. Ti and Al were successively formed on the exposed portion of the contact layer, thereby forming a negative electrode. Through these operations, electrodes of a shape shown in FIG. 4 were fabricated.

The backside of the sapphire substrate of the gallium nitride compound semiconductor multilayer structure which had been provided with the positive electrode and the negative electrode in the above manner was ground and polished, thereby providing a mirror surface. Subsequently, the gallium nitride compound semiconductor multilayer structure was cut into square (350 μm×350 μm) chips. The thus-formed chip was placed on a lead frame and wired to the lead frame with gold wire, thereby fabricating a light-emitting device.

When an operation current was applied to the positive electrode and the negative electrode of the thus-fabricated light-emitting diode in a forward direction, the diode exhibited a forward voltage of 3.2 V at a current of 20 mA, an emission wavelength of 470 nm, and an emission output of 6 mW. Such characteristics of the light-emitting diode can be attained without variation among light-emitting diodes cut and produced from virtually the entirety of the above-fabricated gallium nitride compound semiconductor multilayer structure.

INDUSTRIAL APPLICABILITY

The light-emitting device produced from the gallium nitride compound semiconductor multilayer structure of the present invention operates at low voltage while maintaining satisfactory light emission output. Thus, the present invention is of remarkably great value in the industry.

The invention claimed is:

1. A method for producing a gallium nitride compound semiconductor multilayer structure comprising a substrate, and an n-type layer, a light-emitting layer, and a p-type layer formed on the substrate, the light-emitting layer having a multiple quantum well structure in which a well layer and a barrier layer are alternately stacked repeatedly, said light-emitting layer being sandwiched by the n-type layer and the p-type layer, the gallium nitride compound semiconductor multilayer structure being a light-emitting device emitting blue light or green light, wherein the method comprises forming a thick portion and a thin portion in the well layer by doping the barrier layer with a dopant.

2. A method for producing a gallium nitride compound semiconductor multilayer structure according to claim 1, wherein the dopant is contained at a concentration of $1 \times 10^{17}$ cm$^{-3}$ to $1 \times 10^{19}$ cm$^{-3}$.

3. A method for producing a gallium nitride compound semiconductor multilayer structure comprising a substrate, and an n-type layer, a light-emitting layer, and a p-type layer formed on the substrate, the light-emitting layer having a multiple quantum well structure in which a well layer and a barrier layer are alternately stacked repeatedly, the light-emitting layer being sandwiched between the n-type layer and the p-type layer, wherein the well layer comprises a thick portion and a thin portion, and the barrier layer contains a dopant, wherein the method comprises a step of forming the well layer, which step includes a step of growing a gallium nitride compound semiconductor and a step of decomposing or sublimating a portion of the gallium nitride compound semiconductor.

4. A method for producing a gallium nitride compound semiconductor multilayer structure according to claim 3, wherein the step of growing is performed at a substrate temperature of T1 and the step of decomposing or sublimating is performed at a substrate temperature of T2, wherein T1 and T2 satisfy the relationship: $T1 \leqq T2$.

5. A method for producing a gallium nitride compound semiconductor multilayer structure according to claim 4, wherein T1 falls within a range of 650 to 900° C.

6. A method for producing a gallium nitride compound semiconductor multilayer structure according to claim 5, wherein T2 falls within a range of 700 to 1,000° C.

7. A method for producing a gallium nitride compound semiconductor multilayer structure according to claim 4, wherein the step of decomposing or sublimating is performed while the substrate temperature T1 is elevated to T2.

8. A method for producing a gallium nitride compound semiconductor multilayer structure according to claim 7, wherein the substrate temperature T1 is elevated to T2 at a temperature elevation rate of 1° C./min to 100° C./min.

9. A method for producing a gallium nitride compound semiconductor multilayer structure according to claim 8 above, wherein the temperature elevation rate is 5° C./min to 50° C./min.

10. A method for producing a gallium nitride compound semiconductor multilayer structure according to claim 7, wherein the substrate temperature T1 is elevated to T2 over 30 seconds to 10 minutes.

11. A method for producing a gallium nitride compound semiconductor multilayer structure according to claim 10, wherein the substrate temperature T1 is elevated to T2 over one minute to five minutes.

12. A method for producing a gallium nitride compound semiconductor multilayer structure according to claim 4, wherein the barrier layer is grown at T2.

13. A method for producing a gallium nitride compound semiconductor multilayer structure according to claim 12, wherein the barrier is grown at T2, followed by lowering the substrate temperature to T3 at which further growth is performed.

14. A method for producing a gallium nitride compound semiconductor multilayer structure according to claim 13, wherein T3 is equal to T1.

15. A method for producing a gallium nitride compound semiconductor multilayer structure according to claim 3, wherein the step of growing is performed in an atmosphere containing a nitrogen source and a Group III metal source and the step of decomposing or sublimating is performed in an atmosphere containing a nitrogen source but no Group III metal source.

* * * * *